United States Patent
Neely et al.

(10) Patent No.: US 10,985,568 B1
(45) Date of Patent: Apr. 20, 2021

(54) SYSTEMS AND METHODS USING COLLABORATIVE CONTROLS TO MAINTAIN UNINTENTIONAL ISLANDING STANDARDS

(71) Applicants: National Technology & Engineering Solutions of Sandia, LLC, Albuquerque, NM (US); Michael Ropp, Brookings, SD (US); Dustin Schutz, Brookings, SD (US)

(72) Inventors: Jason C. Neely, Albuquerque, NM (US); Sigifredo Gonzalez, Albuquerque, NM (US); Michael Ropp, Brookings, SD (US); Dustin Schutz, Brookings, SD (US)

(73) Assignees: National Technology & Engineering Solutions of Sandia, LLC, Albuquerque, NM (US); Michael Ropp, Albuquerque, NM (US); Dustin Schutz, Brookings, SD (US)

( * ) Notice: Subject to any disclaimer, the term of this patent is extended or adjusted under 35 U.S.C. 154(b) by 232 days.

(21) Appl. No.: 15/926,971

(22) Filed: Mar. 20, 2018

Related U.S. Application Data

(60) Provisional application No. 62/473,858, filed on Mar. 20, 2017.

(51) Int. Cl.
| | | |
|---|---|---|
| *H02J 3/38* | (2006.01) | |
| *H02M 1/32* | (2007.01) | |
| *G01R 23/02* | (2006.01) | |
| *H02M 7/44* | (2006.01) | |
| *G01R 19/00* | (2006.01) | |

(52) U.S. Cl.
CPC .......... *H02J 3/382* (2013.01); *G01R 19/0084* (2013.01); *G01R 23/02* (2013.01); *H02M 1/32* (2013.01); *H02M 7/44* (2013.01); *H02J 3/388* (2020.01)

(58) Field of Classification Search
CPC ....... H02J 3/382; G01R 19/084; G01R 23/02; H02M 1/32; H02M 7/44
USPC .......................................................... 307/69
See application file for complete search history.

(56) References Cited

U.S. PATENT DOCUMENTS

| | | | |
|---|---|---|---|
| 2013/0051103 A1* | 2/2013 | Roscoe | H02M 7/53871 363/131 |
| 2014/0225457 A1* | 8/2014 | Elliott, II | H02H 3/48 307/125 |
| 2017/0194792 A1* | 7/2017 | Zimmanck | H02J 3/24 |

* cited by examiner

*Primary Examiner* — Daniel J Cavallari
*Assistant Examiner* — Swarna N Chowdhuri
(74) *Attorney, Agent, or Firm* — Daniel J. Jenkins

(57) ABSTRACT

The present invention relates to systems and methods that use separation of time scales to mitigate interaction between unintentional islanding detection schemes and GSFs.

9 Claims, 4 Drawing Sheets

US 10,985,568 B1

SYSTEMS AND METHODS USING COLLABORATIVE CONTROLS TO MAINTAIN UNINTENTIONAL ISLANDING STANDARDS

This application claims priority to U.S. Provisional Patent Application No. 62/473,858, entitled "SYSTEMS AND METHODS USING COLLABORATIVE CONTROLS TO MAINTAIN UNINTENTIONAL ISLANDING STANDARDS," filed Mar. 20, 2017, the disclosure of which are incorporated herein in its entirety.

STATEMENT OF GOVERNMENT INTEREST

The United States Government has rights in this invention pursuant to Contract No. DE-AC04-94AL85000 between the United States Department of Energy and Sandia Corporation, and pursuant to Contract No. DE-NA0003525 between the United State Department of Energy and National Technology & Engineering Solutions of Sandia, LLC, for the operation of the Sandia National Laboratories.

FIELD

The present disclosure is generally directed to electrical grids, and more particularly to methods and systems that provide unintentional islanding conformance.

BACKGROUND

All distributed utility interconnected PV sources must comply with unintentional islanding (UI) standards (run-on-times (ROTs)<2 sec). Unfortunately, the incorporation of advanced inverter capabilities can interfere with conventional UI schemes. These new capabilities include grid support functions (GSFs) like volt/VAr and frequency/watt as well as wider limits on allowable voltage and frequency.

Many UI schemes detect an island by creating signals that attempt to disrupt and destabilize the converter in an islanded state through stimulus signals and positive feedback. Thus, when a substation breaker opens, these disruptions and instabilities cause measurable changes in voltage and/or frequency on the Local Circuit. When these changes are detected, an island is assumed, and the inverter stops delivering power. GSFs allow inverters to tolerate large deviations in voltage and frequency and to provide negative feedback so as to help mitigate deviations in voltage and frequency. These operations create control actions which can thus interfere with those of the UI control to be able to exercise advanced inverter capabilities while maintaining compliance with UI standards, new collaborative controls are needed.

SUMMARY OF THE DISCLOSURE

The present invention is directed to systems and methods that enable collaborative controls through the use of filters that separate the control actions of the GSFs and UI controls into different time regimes or control bandwidths. GSFs thus operate with a control bandwidth relevant to grid support while UI control actions operate with a control bandwidth needed for fast detection of an unintended island. The inverter voltage/current controls and UI controls use frequency and voltage as determined from the phase-locked loop, but the GSFs respond to filtered values of voltage and frequency measurements. This constitutes a "separation of time scales" that mitigates interaction between UI and GSFs.

While UI approaches often operate by disturbing and/or destabilizing voltage and frequency when islanded, the GSFs may stabilize the island and/or mitigate these disturbances. Thus, without the use of filters as disclosed herein, the anti-islanding and GSFs control actions may cancel.

Other features and advantages of the present disclosure will be apparent from the following more detailed description of the preferred embodiment, taken in conjunction with the accompanying drawings which illustrate, by way of example, the principles of the disclosure.

BRIEF DESCRIPTION OF THE DRAWINGS

Wherever possible, the same reference numbers will be used throughout the drawings to represent the same parts.

DETAILED DESCRIPTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete and will fully convey the scope of the invention to those skilled in the art.

The present invention is directed to systems and methods that provide collaborative controls in an electrical grid controller. In an embodiment, a grid controller is disclosed that includes filtering to prevent islanding.

Figure 1:
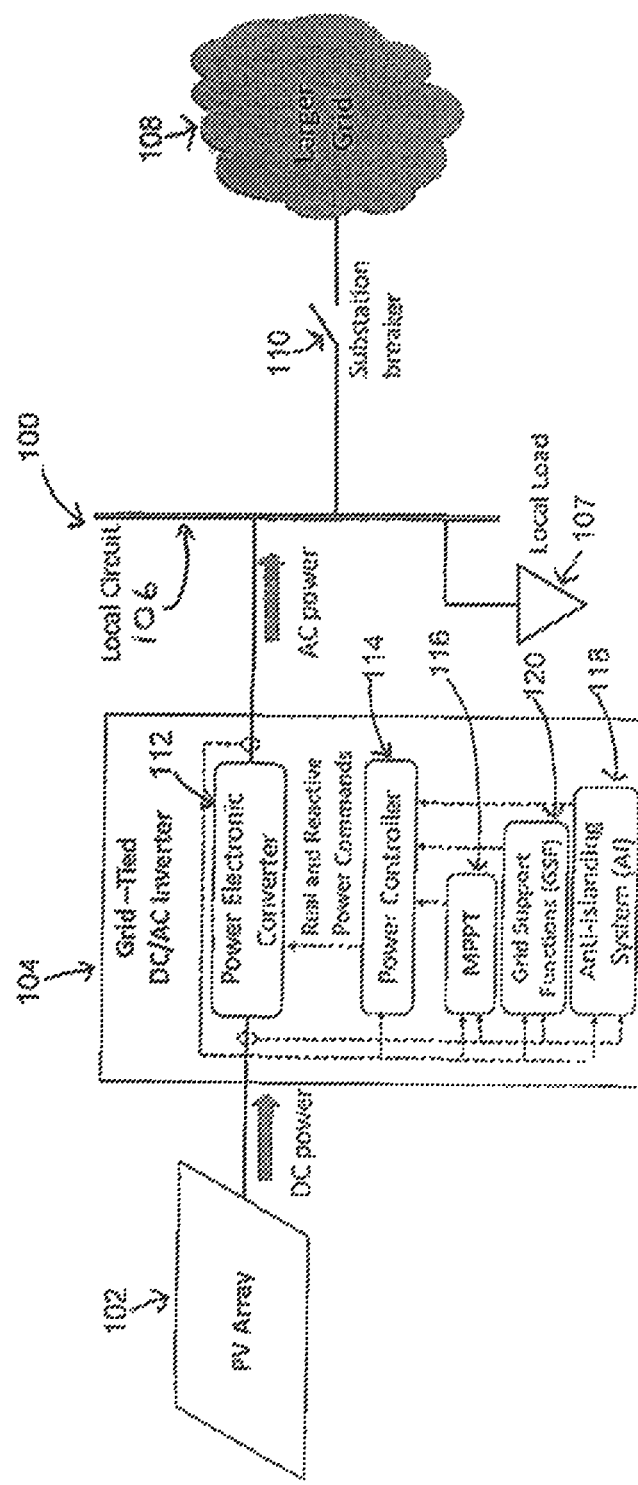
FIG. 1 illustrates a conventional power system.

FIG. 1 illustrates a conventional power system 100. As can be seen in FIG. 1, the power system 100 includes a DC power source 102, a DC to AC power inverter (DC/AC inverter) 104, a local circuit 106 and an electrical grid 108. In this exemplary embodiment, the DC power source 102 is a PV array. In other embodiments, the DC power source 102 may be a PV array, wind/DC generator, a battery, fuel cell, microturbine, flywheel, or other distributed energy resources subject to IEEE 1547 compliance.

The DC/AC inverter (inverter) 104 receives DC power from the DC power source 102 and converts the DC power to AC power. The local circuit 106 receives the AC power from the DC/AC invertor 104 and may provide AC power to a local load 107. In an embodiment, the local circuit 106 may be an electrical bus or a distribution scale circuit. The local circuit 106 may be connected to an electrical grid 108. The electrical grid 108 may be a low voltage facility circuit, a utility distribution circuit, or a utility sub transmission circuit of an electrical grid. The electrical connection between the local circuit 106 and the electrical grid 108 may include an external device 110 that isolates the ac power inverter from the local electrical grid when a loss of grid has occurred and isolates within the 2 second requirement. In an embodiment, the external device may be a breaker or sub-station breaker.

The inverter 104 includes a power electronic converter (converter) 112 that converts the dc power into utility-grade ac power and energizes the electric grid. The inverter 104 also includes a power controller software module (controller) 114 that computes real and reactive power commands and sends these commands as signals to the converter 112. The controller 114 resolves information from other software modules, including the maximum power point tracker (MPPT) 116 and the anti-islanding (AI) system 118. The MPPT 116 functions to extract all available dc power and allows the ac power inverter to convert it to ac power and energize the electric grid. The AI system monitors the existence of the electrical grid and if a power failure occurs, its function is to recognize such an occurrence and cease to energize the electric grid and trip or shutdown within a time requirement, for example, a 2 second requirement.

The inverter 104 also includes a grid support functions module (GSF module) 120 that allows the ac power inverter to ride-through voltage and frequency anomalies and depending on the level of excursion from nominal voltage or frequency, determines the appropriate action. The voltage and frequency regulating functions will determine the reactive power generation and active power generation delivered by the ac power inverter to the electrical grid.

The AI system 118 detects an island by creating signals that attempt to disrupt and destabilize the converter 112 in an islanded state through stimulus signals and positive feedback. Thus, when a substation breaker opens, for example, creating an islanding condition, these disruptions and instabilities cause measurable changes in voltage and/or frequency on the local circuit 106. When these changes are detected, an island is assumed, and the inverter 104 stops delivering AC power.

New standards, however, will require that inverters provide collaborative Grid Support Functions (GSFs). These collaborative GSFs allow inverters to tolerate large deviations in voltage and frequency and to provide negative feedback to help mitigate deviations in voltage and frequency. These operations create control actions which can interfere with those of the AI.

Figure 2:
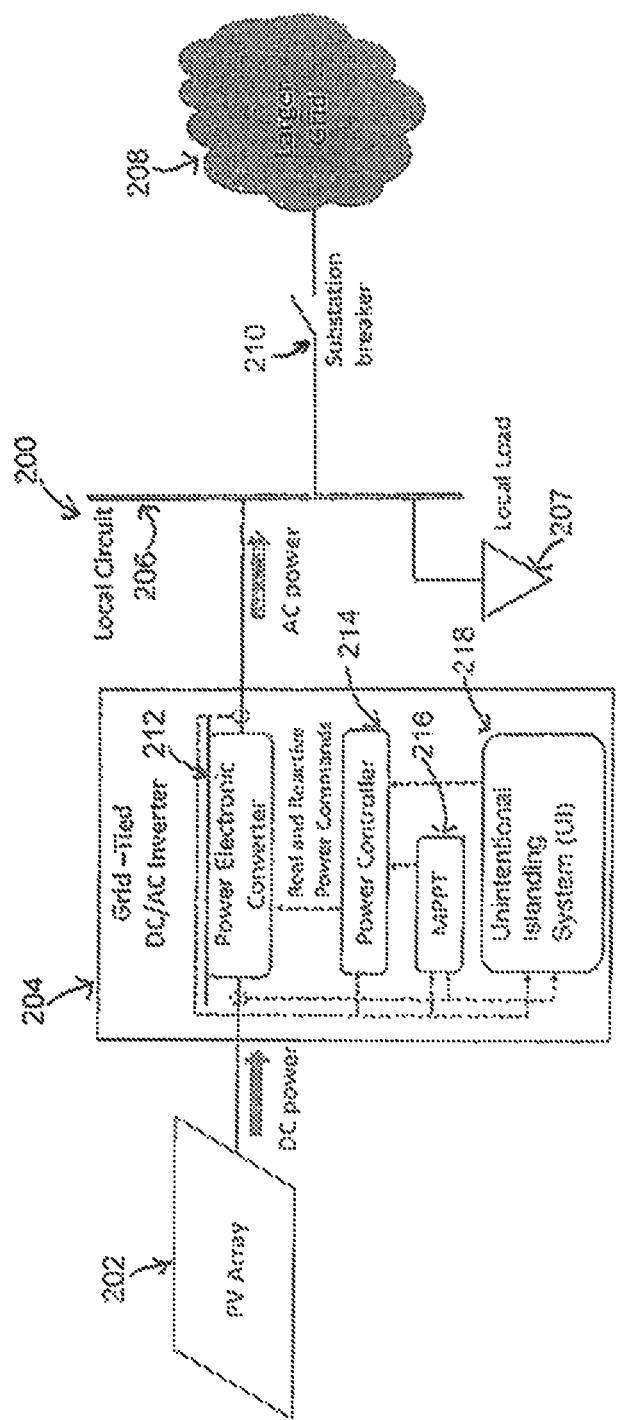
FIG. 2 illustrates a power system including a DC/AC power inverter according to an embodiment of the disclosure.

FIG. 2 illustrates a power system 200 according to an embodiment of the disclosure. As can be seen in FIG. 2, the power system 200 includes a DC power source 202, a DC to AC power inverter (DC/AC inverter) 204, a local circuit 206 and an electrical grid 208. The DC/AC inverter (inverter) 204 receives DC power from the DC power source 202 and converts the DC power to AC power. The local circuit 206 receives the AC power from the DC/AC invertor 204 and may provide AC power to a local load 207. The local circuit 206 may be connected to an electrical grid 208. The electrical connection between the local circuit 206 and the electrical grid 208 may include a substation breaker 210.

The inverter 204 includes a power electronic converter (converter) and a power controller software module (controller) 214 that computes real and reactive power commands and sends these commands as signals to the converter 212. The controller 214 resolves information from other software modules, including the maximum power point tracker (MPPT) 216 and a collaborative GSF and UI controls module, referred to herein as a Collaborative Controls (CC) module 218. The CC module 218 computes and sends real and reactive power command signals to the power controller based on voltage and frequency measurements from the inverter. The CC module command signals have two components. One component includes a fast time-scale disruption with high-bandwidth positive feedback control that aims to force the unintentionally islanded converter to a disallowed operating point, resulting in island detection and the inverter ceasing to supply power. These are the unintentional islanding (UI) controls. Another control component considers the measured voltage and frequency at the output of the inverter and computes real and reactive power components that provide negative feedback or other changes in power delivery that would serve to mitigate voltage and frequency deviations. These functions provide grid support (i.e. Grid Support Functions (GSFs)) and are operated at slower time scales such that the inverter supports the grid when connected. The GSFs, however, do not respond fast enough to interfere with the UI controls. The CC module computes both components and forms a composite signal to be sent to the Power Controller. Attributes of the signal components (i.e. filter time constants) are adjusted to ensure the composite CC module signal accomplishes UI and GSF objectives.

The CC module 218 allows the UI and GSF functions to reside within the same software module, allowing for one harmonized signal to be sent to the Power Controller that accomplishes both the UI function and the GSF functions. By co-locating both functions into one module, a separation of time scales may be applied to avoid interference of one control signal by another. In contrast, two uncoordinated autonomous functions may interfere. The use of filters is one method to avoid interference, but the filter settings must be selected in relation to one another to ensure a separation of time scales.

Figure 3:
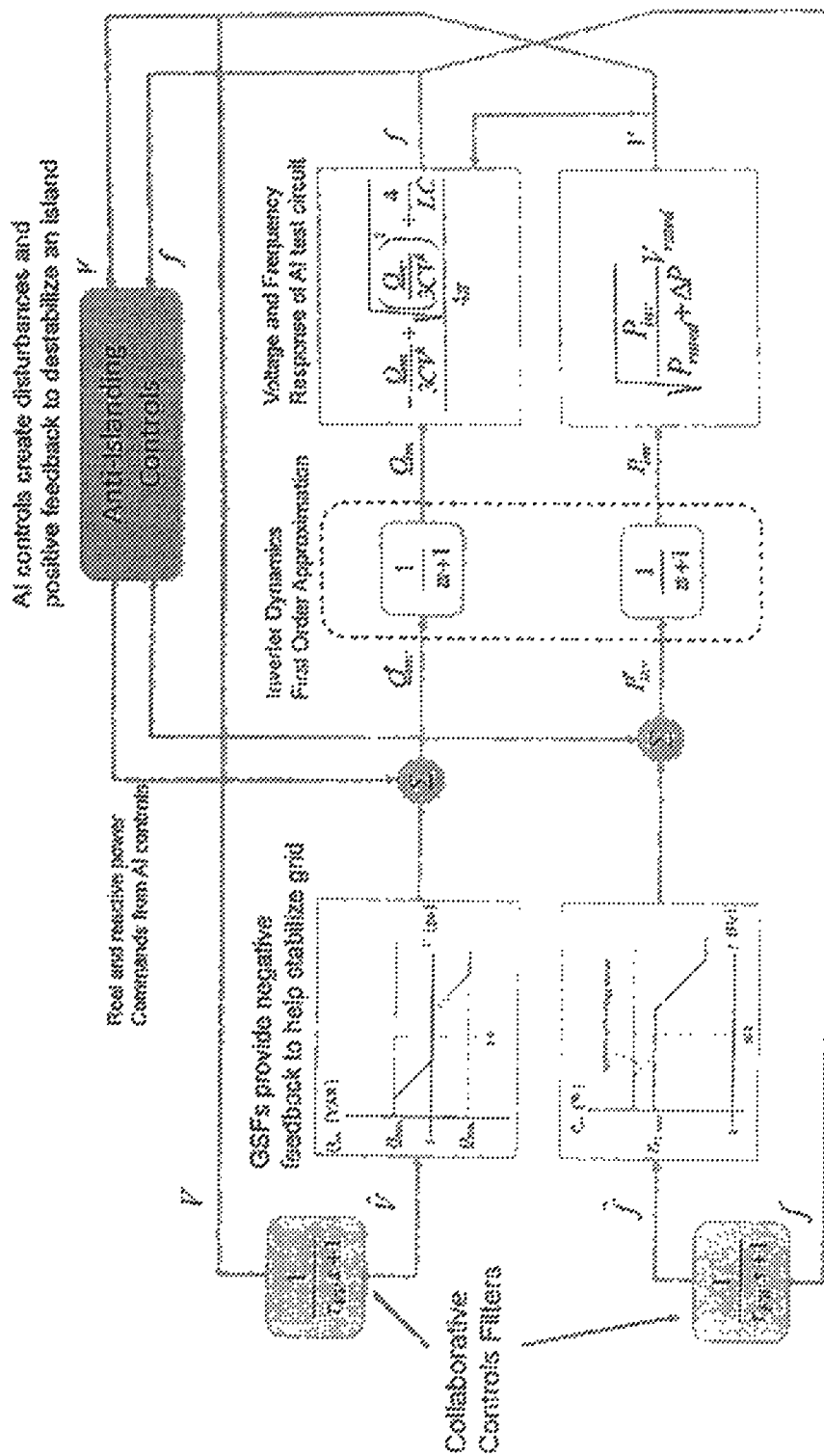
FIG. 3 illustrates an islanded inverter system including an unintentional islanding (UI) control and two GSF functions according to an embodiment of the disclosure.

FIG. 3 is a model showing the interaction of grid support functions with anti-islanding schemes, in particular, in active frequency perturbation schemes for a system configured for UI testing. The locations of filters are illustrated to the left of FIG. 3. Filter placement enables a collaborative controls scheme according to an embodiment of the disclosure.

The model uses a 50 kW 3-phase PV inverter, herein referred to as the Fiona inverter, or simply Fiona, or inverter, containing an isolation transformer that connects to a 480 Vac bus. The inverter utilizes an Active Frequency Drift (AFD) or alternatively a Sandia Frequency Shift (SFS) depending on the implementation. The frequency measurement used for both the AFD and for the frequency-watt function is taken from the phase-locked loop (PLL) frequency state estimate. This estimate converges to the real frequency at a high rate. In an embodiment, a separate filtered frequency may be used for the frequency-watt function to avoid interaction between the AFD and the negative feedback of the frequency-watt functions.

Initially, after the freq-watt, volt-VAr, L/HVRT and L/HFRT capabilities were verified with the grid simulator, four tests were conducted with the following results:

1. Real power match at 30 kW, LC adjusted for zero reactive power and quality factor of 1, advanced functions disabled, AFD unintentional islanding scheme enabled. An island was detected when the utility disconnected, and the inverter ceased to deliver power.
2. Real power match at 30 kW, LC adjusted for zero reactive power and quality factor of 1, advanced functions included freq-watt, volt-VAr, L/HVRT and L/HFRT were enabled, AFD unintentional islanding scheme enabled. The inverter islanded indefinitely indicating an interaction between the AFD and advanced functions prohibiting an island detection.
3. Real power match at 30 kW, LC adjusted for zero reactive power and quality factor of 1, advanced functions included freq-watt, volt-VAr, L/HVRT and L/HFRT were enabled, AFD unintentional islanding scheme enabled, and a filter was added with $\tau_{FW}$=3.14 sec (2 Hz bandwidth) between the PLL and freq-watt function. An island was detected within approximately 0.7 sec when the utility disconnected, and the inverter ceased to deliver power.

4. Real power match at 30 kW, LC adjusted for zero reactive power and quality factor of 1, advanced functions included freq-watt, volt-VAr, L/HVRT and L/HFRT were enabled, AFD unintentional islanding scheme enabled, and the filter was disabled. This test is essentially a repeat of test 2. The inverter islanded indefinitely.

Tests were conducted that incorporate collaborative controls into a commercial inverter. The model has the following blocks built into it: hardware components including DC and AC filters and switch averaged bridge, generic PV array model using a controllable voltage source and series impedance with irradiance as an input, MDPT, four standard relay blocks with user programmable trip settings, active unintentional islanding logic, DQ based current controls with decoupling logic, and grid support functions (VV and FW) with user programmable settings.

Figure 4:
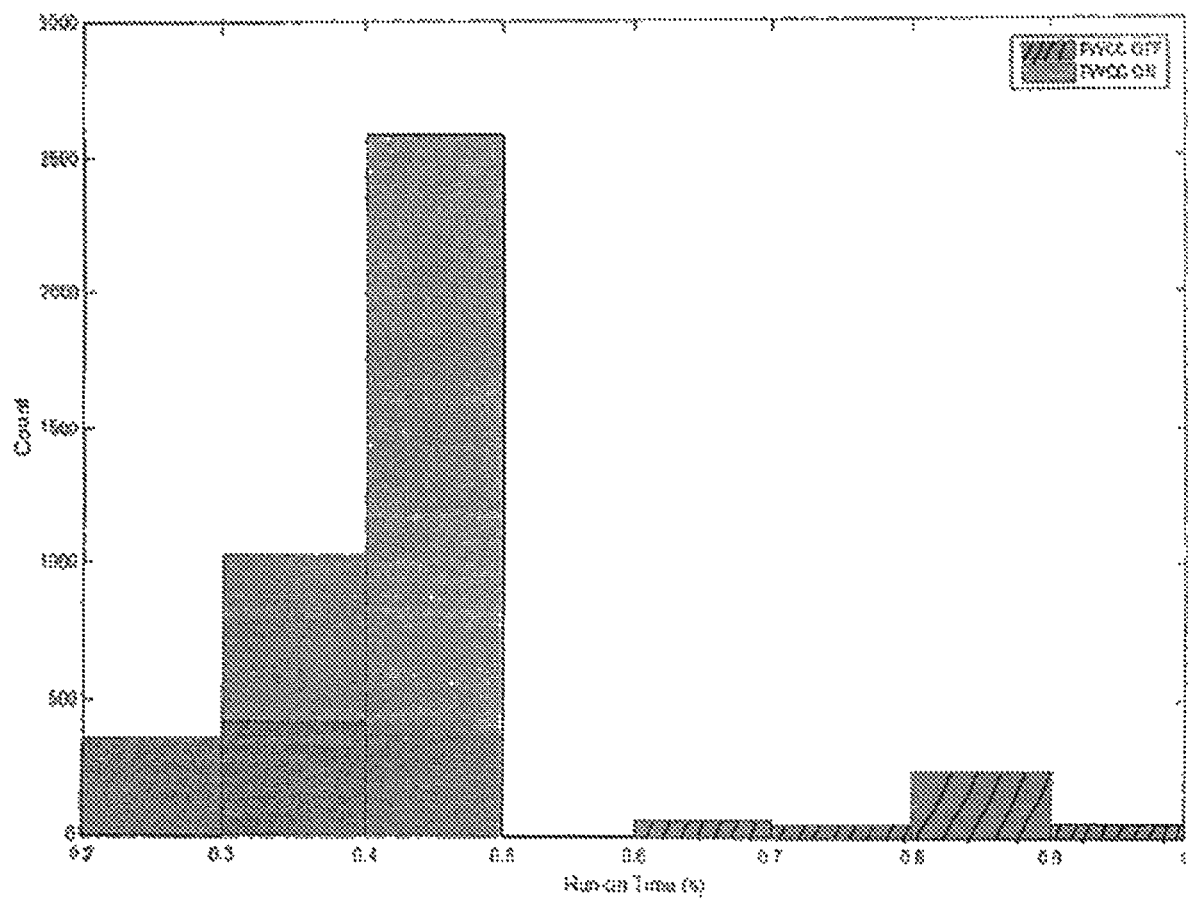
FIG. 4 shows a comparison of SFS at 100% irradiance with frequency-watt, 1547A trips, with and without collaborative controls, according to an embodiment of the disclosure.

Simulated run-on times (ROTs) were conducted for different operating conditions. By cumulating the results over a surface, it is possible to generate a histogram of ROTs for a particular operating condition was generated. FIG. 4 shows the results with and without the collaborative control filter. In this case, it is noted that a collaborative control filter with 2 sec cut off frequency reduced the peak ROT from nearly 1 second to below 0.5 seconds, thus improving the anti-islanding performance considerably while implementing grid support functions and new 1547A relay trip points.

The invention being thus described, it will be obvious that the same may be varied in many ways. Such variations are not to be regarded as a departure from the spirit and scope of the invention, and all such modifications as would be obvious to one skilled in the art are intended to be included within the scope of the appended claims. It is intended that the scope of the invention be defined by the claims appended hereto. The entire disclosures of all references, applications, patents and publications cited above are hereby incorporated by reference.

In addition, many modifications may be made to adapt to a particular situation or material to the teachings of the disclosure without departing from the essential scope thereof. Therefore, it is intended that the disclosure not be limited to the particular embodiment disclosed as the best mode contemplated for carrying out this disclosure, but that the disclosure will include all embodiments falling within the scope of the appended claims.

What is claimed is:

1. A DC/AC inverter, comprising: a power electronic converter and a collaborative controls module that uses frequency and voltage as determined from a phase-locked loop; wherein the collaborative controls module comprises grid support functions that respond to filtered voltage and frequency measurements separated from unintentional-islanding controls; wherein the grid support functions are selected from the group consisting of volt/Variance ratio, frequency/watt ratio and limits on voltage and frequency; and wherein the collaborative controls module comprises one or more filters that separate the grid support function controls and unintentional islanding controls into different time regimes or control bandwidths such that the unintentional islanding controls use frequency and voltage as determined from the phase-locked loop while the grid support function controls respond to filtered values of voltage and frequency measurements of the unintentional islanding controls such that one harmonized signal is sent from the DC/AC inverter to a power controller that accomplishes both unintentional islanding and grid support functions.

2. The DC/AC inverter of claim 1, further comprising: a power controller software module that computes real and reactive power commands and sends these commands as signals to the power electronic converter.

3. The DC/AC inverter of claim 1, further comprising: a maximum power point tracker that extracts all available DC power and allows the DC/AC inverter to convert DC to AC power and energize the electric grid.

4. The DC/AC inverter of claim 1, wherein the grid support functions operate with a control bandwidth relevant to grid support while UI control actions operate with a control bandwidth needed for fast detection of an unintended island.

5. A collaborative controls module comprising: one or more filters that separate grid support functions and unintentional islanding controls into different time regimes or control bandwidths such that the unintentional islanding controls use frequency and voltage as determined from the phase-locked loop while the grid support function controls respond to filtered values of voltage and frequency measurements of the unintentional islanding controls such that one harmonized signal is sent from the DC/AC inverter to a power controller that accomplishes both unintentional islanding and grid support functions; wherein the grid support functions are selected from the group consisting of volt/Variance ratio, frequency/watt ratio and limits on voltage and frequency.

6. The collaborative controls module of claim 5, wherein the grid support functions operate with a control bandwidth relevant to grid support while UI control actions operate with a control bandwidth needed for fast detection of an unintended island.

7. The collaborative controls module of claim 5, further comprising: a fast time-scale disruption with high-bandwidth positive feedback control that forces a converter to a disallowed operating point, resulting in island detection and an inverter to cease to supply power; and a control component that considers measured voltage and frequency at the output of the inverter and computes real and reactive power components that provide negative feedback or other changes in power delivery serve to mitigate voltage and frequency deviations.

8. A method to avoid islanding in a grid, comprising: using frequency and voltage from a phase-locked loop of a DC/AC inverter voltage/current controls of an inverter and collaborative grid support functions and unintentional-island detection to avoid islanding by changing grid support function and unintentional islanding timeframe criteria, wherein the collaborative grid support functions are selected from the group consisting of volt/Variance ratio, frequency/watt ratio and limits on voltage and frequency; and wherein control actions of the unintentional-islanding detection and the collaborative grid support functions are separated by filters into different time regimes or control bandwidths such that the unintentional islanding controls use frequency and voltage as determined from the phase-locked loop while the grid support function controls respond to filtered values of voltage and frequency measurements of the unintentional islanding controls such that one harmonized signal is sent from the DC/AC inverter to a power controller that accomplishes both unintentional islanding and grid support functions.

9. The method of claim 8, wherein the grid support functions respond to filtered values of voltage and frequency measurements of the inverter.

\* \* \* \* \*